United States Patent
Liu et al.

(10) Patent No.: US 7,319,244 B2
(45) Date of Patent: Jan. 15, 2008

(54) LENS ASSEMBLY FOR SIDEWARD LIGHT EMISSION

(75) Inventors: Ming-Dah Liu, Miao Li County (TW); Huang-Jen Chen, Miao Li County (TW)

(73) Assignee: Coretronic Corporation, Miao Li County (TW)

( * ) Notice: Subject to any disclaimer, the term of this patent is extended or adjusted under 35 U.S.C. 154(b) by 128 days.

(21) Appl. No.: 11/397,144

(22) Filed: Apr. 4, 2006

(65) Prior Publication Data

US 2006/0226436 A1    Oct. 12, 2006

(30) Foreign Application Priority Data

Apr. 12, 2005    (TW) ................ 94111516 A

(51) Int. Cl.
  *H01L 33/00*    (2006.01)
(52) U.S. Cl. .................. 257/98; 257/95; 257/99; 257/E33.067
(58) Field of Classification Search .............. 257/98, 257/99, 95, E33.067
See application file for complete search history.

(56) References Cited

U.S. PATENT DOCUMENTS

| | | | | |
|---|---|---|---|---|
| 6,607,286 B2* | 8/2003 | West et al. | ............... | 362/255 |
| 6,972,439 B1* | 12/2005 | Kim et al. | ............... | 257/98 |
| 7,034,343 B1* | 4/2006 | Kim et al. | ............... | 257/98 |
| 7,098,485 B2* | 8/2006 | Isokawa | ............... | 257/98 |
| 7,118,262 B2* | 10/2006 | Negley | ............... | 362/555 |
| 7,214,116 B2* | 5/2007 | Takekuma | ............... | 445/24 |
| 2006/0208267 A1* | 9/2006 | Chin et al. | ............... | 257/98 |
| 2006/0208269 A1* | 9/2006 | Kim et al. | ............... | 257/98 |

* cited by examiner

*Primary Examiner*—Evan Pert
*Assistant Examiner*—Victor A. Mandala, Jr.
(74) *Attorney, Agent, or Firm*—Ohlandt, Greeley, Ruggiero & Perle L.L.P.

(57) ABSTRACT

A lens assembly for sideward light emission includes a lens and a lens cap. The lens has a cup portion, an open end portion, and first and second refracting portions. The cup portion surrounds a light source. The open end portion defines an opening. The first refracting portion interconnects the cup portion and the open end portion. The second refracting portion is disposed in the lens and is formed on the first refracting portion. The lens cap is mounted to the open end portion of the lens for covering the opening.

7 Claims, 3 Drawing Sheets

LENS ASSEMBLY FOR SIDEWARD LIGHT EMISSION

CROSS-REFERENCE TO RELATED APPLICATION

This application claims priority of Taiwanese application no. 094111516, filed on Apr. 12, 2005.

BACKGROUND OF THE INVENTION

1. Field of the Invention

This invention relates to a lens assembly, more particularly to a lens assembly that guides emission of light sideways.

2. Description of the Related Art

FIG. 1 illustrates a conventional lens that defines a central axis 10, and that includes a funnel-shaped portion 11, and a cup portion 12 opposite to the funnel-shaped portion 11. The funnel-shaped portion 11 has reflecting and refracting surfaces 111, 112. The cup portion 12 confines a light source 1.

When the light source 1 emits light, a portion of the light, as indicated by arrow (X), is refracted by the cup portion 12, is internally reflected by the reflecting surface 111 of the funnel-shaped portion 11, and is refracted by the refracting surface 112 of the funnel-shaped portion 11 such that the light exits the funnel-shaped portion 11 in lateral directions relative to the central axis 10. Moreover, another portion of the light, as indicated by arrow (Y), is refracted by the cup portion 12 such that the light exits the cup portion 12 in lateral directions relative to the central axis 10.

The aforementioned conventional lens is disadvantageous in that a small portion of the light emitted by the light source 1 that forms a relatively small angle with respect to the central axis 10, passes through the reflecting surface 111 of the funnel-shaped portion 11, which results in a light spot. Moreover, the reflecting and refracting surfaces 111, 112 of the funnel-shaped portion 11 of the lens intersect each other to form an acute angle therebetween. As such, the conventional lens has a fragile structure.

SUMMARY OF THE INVENTION

Therefore, the object of the present invention is to provide a lens assembly that is capable of overcoming the aforesaid drawbacks of the conventional lens.

According to the present invention, a lens assembly for sideward light emission comprises a lens and a lens cap. The lens defines a central axis, and has a cup portion, an open end portion, and first and second refracting portions. The cup portion is adapted to surround a light source that is disposed on the central axis. The open end portion is opposite to the cup portion in a direction of the central axis, surrounds the central axis, and defines an opening. The first refracting portion surrounds the central axis, and interconnects the cup portion and the open end portion. The second refracting portion is disposed in the lens and is formed on the first refracting portion. The lens cap is mounted to the open end portion of the lens for covering the opening. A first portion of light emitted by the light source is incident on and is reflected by the lens cap to the first refracting portion of the lens, and is refracted by the first refracting portion of the lens such that the first portion of light exits the lens in lateral directions relative to the central axis. A second portion of light emitted by the light source is refracted by the second refracting portion of the lens, is internally reflected by the first refracting portion of the lens, and is refracted by the first refracting portion of the lens such that the second portion of light exits the lens in lateral directions relative to the central axis.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
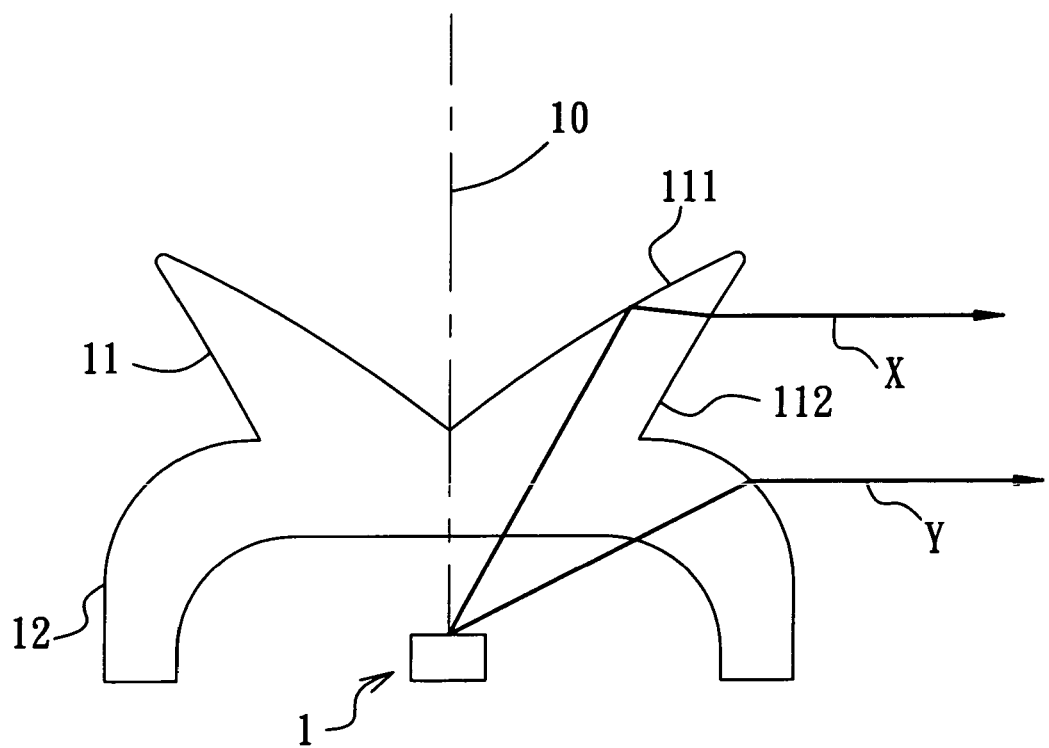
FIG. 1 is a schematic view of a conventional lens.

Before the present invention is described in greater detail, it should be noted that like elements are denoted by the same reference numerals throughout the disclosure.

Figure 2:
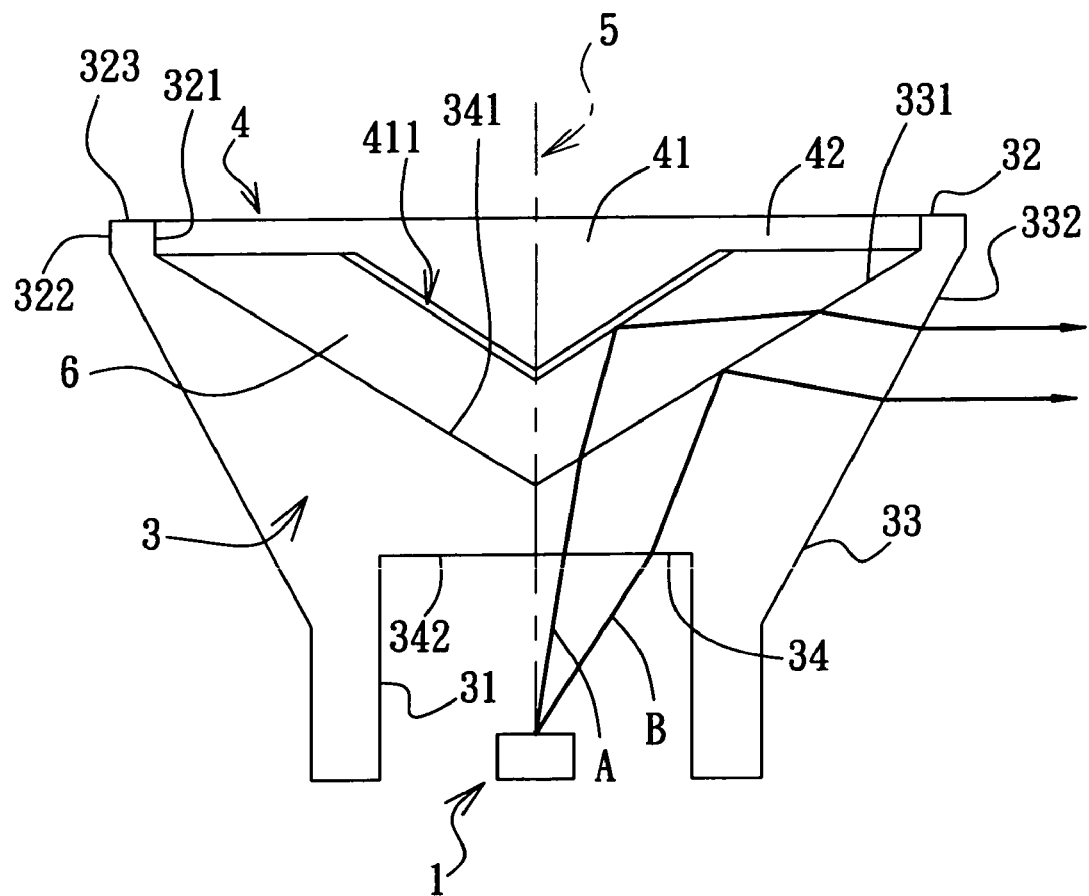
FIG. 2 is a schematic view of the first preferred embodiment of a lens assembly according to the present invention.

Referring to FIG. 2, the first preferred embodiment of a lens assembly according to this invention is shown to include a lens 3 and a lens cap 4.

The lens assembly serves to guide light radiated by a light source 1, such as a light-emitting diode (LED), in a manner that will be described hereinafter.

The lens 3 is generally funnel-shaped, defines a central axis 5, and has a cup portion 31, an open end portion 32, and first and second refracting portions 33, 34. The light source 1 is disposed on the central axis 5. The cup portion 31 of the lens 3 surrounds the light source 1. The open end portion 32 of the lens 3 is opposite to the cup portion 31 of the lens 3 in a direction of the central axis 5, surrounds the central axis 5, and defines an opening. The first refracting portion 33 of the lens 3 diverges upwardly, surrounds the central axis 5, interconnects the cup portion 31 and the open end portion 32 of the lens 3, and has inner and outer wall surfaces 331, 332 opposite to each other in radial directions relative to the central axis 5. The second refracting portion 34 of the lens 3 is disposed in the lens 3, is formed on the first refracting portion 33, extends across the inner wall surface 331 of the first refracting portion 33 of the lens 3, and has top and bottom wall surfaces 341, 342. The top wall surface 341 of the second refracting portion 34 diverges upwardly. The bottom wall surface 342 of the second refracting portion 34 is flat. In this embodiment, the lens 3 is made from a light transmissible material, such as polymethylmethacrolate (PMMA) or polycarbonate (PC).

The lens cap 4 is mounted to the open end portion 32 of the lens 3 so as to cover the opening. In this embodiment, the lens cap 4 has a center portion 41, and a peripheral portion 42 that extends radially from the center portion 41 of the lens cap 4. The center portion 41 of the lens cap 4 has a conic bottom part 411 which has a shape corresponding to that of the top wall surface 341 of the second refracting portion 34 of the lens 3. It is noted that when the lens cap 4 is mounted to the open end portion 32 of the lens 3, a clearance 6 exists between the bottom part 411 of the center portion 41 of the lens cap 4 and the top wall surface 341 of the second refracting portion 34 of the lens 3. Preferably, the bottom part 411 of the center portion 41 of the lens cap 4 is coated with a highly reflective material, such as by plating, printing, or vapor deposition.

Referring to light traces in FIG. 2, a first portion of the light emitted by the light source 1, which forms a relatively small angle with respect to the central axis 5, as indicated by arrow (A), is refracted by the bottom and top wall surfaces 342, 341 of the second refracting portion 34 of the lens 3, is incident on and is reflected by the bottom part 411 of the center portion 41 of the lens cap 4 to the first refracting portion 33 of the lens 3, and is refracted by the inner and outer wall surfaces 331, 332 of the first refracting portion 33 of the lens 3 such that the first portion of light exits the outer wall surface 332 of the first refracting portion 33 of the lens 3 in lateral directions relative to the central axis 5. Moreover, a second portion of the light emitted by the light source 1, as indicated by arrow (B), is refracted by the bottom wall surface 342 of the second refracting portion 34, is internally reflected by the inner wall surface 331 of the first refracting portion 33 of the lens 3, and is refracted by the outer wall surface 332 of the first refracting portion 33 of the lens 3 such that the second portion of light exits the outer wall surface 332 of the first refracting portion 33 of the lens 3 in lateral directions relative to the central axis 5.

It is noted that the lens cap 4 prevents emission of the first portion of light emitted by the light source 1 through the opening, thereby preventing light spot formation. Moreover, the open end portion 32 of the lens 3 has inner and outer wall surfaces 321, 322, and an end face 323 that interconnects the inner and outer wall surfaces 321, 322 of the open end portion 32 of the lens 3. The outer wall surface 322 and the end face 323 of the open end portion 32 of the lens 3 form a right angle therebetween. As such, the lens assembly of this invention does not easily broken or damaged. Further, reflectivity of the reflective material coated on the bottom part 411 of the center portion 41 of the lens cap 4 may be chosen so as to control the amount of the first portion of the light being reflected.

Figure 3:
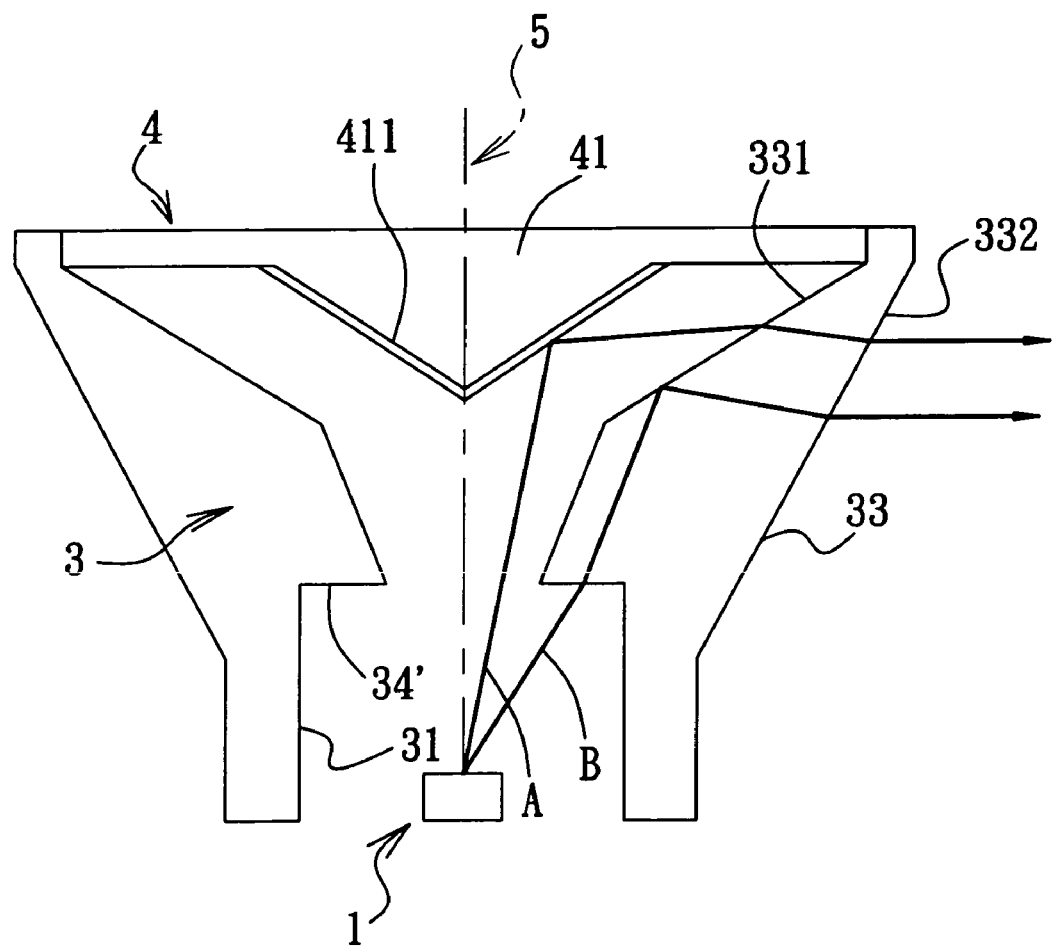
FIG. 3 is a schematic view of the second preferred embodiment of a lens assembly according to the present invention.

FIG. 3 illustrates the second preferred embodiment of a lens assembly according to this invention. When compared with the previous embodiment, the second refracting portion 34' of the lens 3 is annular and surrounds the central axis 5. As such, the first portion of light emitted by the light source 1 is directly incident on the bottom part 411 of the center portion 41 of the lens cap 4, thereby minimizing attenuation of the first portion of the light emitted by the light source 1.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A lens assembly for sideward light emission, comprising:
    a lens defining a central axis, and having
        a cup portion adapted to surround a light source that is disposed on the central axis,
        an open end portion opposite to said cup portion in a direction of the central axis, surrounding the central axis, and defining an opening,
        a first refracting portion surrounding the central axis, and interconnecting said cup portion and said open end portion, and
        a second refracting portion disposed in said lens and formed on said first refracting portion; and
    a lens cap mounted to said open end portion of said lens for covering said opening,
    wherein a first portion of light emitted by the light source is incident on and is reflected by said lens cap to said first refracting portion of said lens, and is refracted by said first refracting portion of said lens such that the first portion of light exits said lens in lateral directions relative to the central axis, and
    wherein a second portion of light emitted by the light source is refracted by said second refracting portion of said lens, is internally reflected by said first refracting portion of said lens, and is refracted by said first refracting portion of said lens such that the second portion of light exits said lens in lateral directions relative to the central axis.

2. The lens assembly as claimed in claim 1, wherein said second refracting portion of said lens extends across said first refracting portion of said lens, and refracts the first portion of the light emitted by the light source prior to being incident on and reflected by said lens cap.

3. The lens assembly as claimed in claim 1, wherein a clearance exists between said lens cap and said second refracting portion of said lens when said lens cap is mounted to said open end portion.

4. The lens assembly as claimed in claim 1, wherein said lens is made from a light transmissible material.

5. The lens assembly as claimed in claim 1, wherein said lens cap has a bottom part which has a shape corresponding to that of said top wall surface of said second refracting portion and which is coated with a highly reflective layer.

6. The lens assembly as claimed in claim 1, wherein said second refracting portion of said lens is annular and surrounds the central axis.

7. The lens assembly as claimed in claim 1, wherein said open end portion of said lens has inner and outer wall surfaces, and an end face that interconnects said inner and outer wall surfaces of said open end portion of said lens, said outer wall surface and said end face of said open end portion of said lens form a right angle therebetween.

* * * * *